US012767522B2

(12) United States Patent
Huang et al.

(10) Patent No.: US 12,767,522 B2
(45) Date of Patent: Oct. 20, 2026

(54) MEMS MICROPHONE PACKAGE

(71) Applicant: Fortemedia, Inc., Santa Clara, CA (US)

(72) Inventors: Yen-Son Paul Huang, Santa Clara, CA (US); Iou-Din Jean Chen, Fremont, CA (US); Shih-Chung Wang, Hsinchu City (TW); Yung-Wei Chen, Zhubei City (TW)

(73) Assignee: FORTEMEDIA, INC., Milpitas, CA (US)

(*) Notice: Subject to any disclaimer, the term of this patent is extended or adjusted under 35 U.S.C. 154(b) by 479 days.

(21) Appl. No.: 18/156,034

(22) Filed: Jan. 18, 2023

(65) Prior Publication Data

US 2023/0391610 A1 Dec. 7, 2023

Related U.S. Application Data

(60) Provisional application No. 63/347,592, filed on Jun. 1, 2022.

(51) Int. Cl.
*B81B 7/00* (2006.01)

(52) U.S. Cl.
CPC ...... *B81B 7/008* (2013.01); *B81B 2201/0257* (2013.01); *B81B 2203/0127* (2013.01); *B81B 2203/033* (2013.01); *B81B 2203/0353* (2013.01); *B81B 2207/015* (2013.01); *B81B 2207/096* (2013.01)

(58) Field of Classification Search
None
See application file for complete search history.

(56) References Cited

U.S. PATENT DOCUMENTS

2012/0189144 A1* 7/2012 Delaus .................. B81C 1/0023 381/174
2013/0140655 A1* 6/2013 Yeh ...................... H04R 31/006 438/51
2015/0189446 A1* 7/2015 Wang ................... H04R 19/005 381/174
2015/0264463 A1* 9/2015 Kuzuyama ............ B81C 1/0023 381/174
2017/0006368 A1* 1/2017 Brioschi ................ B81B 7/008
2017/0334714 A1* 11/2017 Gao ........................ H01L 23/10
2018/0063646 A1* 3/2018 Liao ....................... H04R 19/04
2022/0002145 A1* 1/2022 Chang .................. B81B 7/0061

* cited by examiner

*Primary Examiner* — Benjamin P Sandvik
(74) *Attorney, Agent, or Firm* — McClure, Qualey & Rodack, LLP

(57) ABSTRACT

A MEMS microphone package is provided. The MEMS microphone package includes a substrate and a circuit device, the substrate has a conductive structure, and the circuit device has through silicon via structures that are electrically connected to the conductive structure. The MEMS microphone package also includes a sensor disposed on the substrate and having a connecting structure disposed on the bottom of the sensor. The connecting structure is electrically connected to the substrate and the circuit device. The MEMS microphone package further includes a cap covering the circuit device and the sensor and separated from the circuit device and the sensor.

6 Claims, 5 Drawing Sheets

MEMS MICROPHONE PACKAGE

CROSS REFERENCE TO RELATED APPLICATIONS

This application claims the benefit of U.S. Provisional Application No. 63/347,592, filed on Jun. 1, 2022, the entirety of which is incorporated by reference herein.

BACKGROUND OF THE INVENTION

Field of the Invention

Embodiments of the present disclosure relate in general to a microphone package, and in particular they relate to a micro-electro-mechanical system (MEMS) microphone package.

Description of the Related Art

The current trend in personal electronics is toward fabricating slim, compact, lightweight and high-performance electronic devices, including microphones. A microphone is used to receive sound waves and convert acoustic signals into electric signals. Microphones are widely used in everyday life and are installed in such electronic products as telephones, mobiles phones, and recording pens. In a capacitive microphone, variations in acoustic pressure (i.e., local pressure deviation from the ambient atmospheric pressure caused by sound waves) force the diaphragm to deform correspondingly, and the deformation of the diaphragm induces a capacitance variation. The variation of acoustic pressure of the sound waves can thus be obtained by detecting voltage difference caused by capacitance variation.

This is distinct from conventional electret condenser microphones (ECM), in which mechanical and electronic elements of micro-electro-mechanical system (MEMS) microphones can be integrated on a semiconductor material using integrated circuit (IC) technology to fabricate a miniature microphone. MEMS microphones have such advantages as a compact size, being lightweight, and having low power consumption, and they have therefore entered the mainstream of miniaturized microphones.

Existing MEMS microphones usually use a wire-bonding package, which needs to reserve space for wire-bonding (e.g., the space between the chip and the MEMS microphone, or the space between the chip and the cap), so that the size (volume) of the MEMS microphone package cannot be effectively reduced.

BRIEF SUMMARY OF THE INVENTION

The micro-electro-mechanical system (MEMS) microphone package in the embodiments according to the present disclosure may use a stack structure instead of wire bonding, which can effectively reduce the amount of space in the package, thereby reducing the overall size of the package.

Some embodiments of the present disclosure include a MEMS microphone package. The MEMS microphone package includes a substrate and a circuit device, the substrate has a conductive structure, and the circuit device has through silicon via structures that are electrically connected to the conductive structure. The MEMS microphone package also includes a sensor disposed on the substrate and having a connecting structure disposed on the bottom of the sensor. The connecting structure is electrically connected to the substrate and the circuit device. The MEMS microphone package further includes a cap covering the circuit device and the sensor and separated from the circuit device and the sensor.

In some embodiments, the circuit device is embedded in the substrate.

In some embodiments, a portion of the sensor is stacked on the circuit device.

In some embodiments, the MEMS microphone package further includes an underfill glue and solder balls, the underfill glue is disposed between the circuit device and the substrate, and the solder balls penetrate the underfill glue and electrically connected to the through silicon via structures and the conductive structure.

In some embodiments, the sensor includes a sensing structure for sensing sound waves.

In some embodiments, the substrate has an acoustic port corresponding to the sensing structure.

In some embodiments, the cap includes an acoustic port for receiving sound waves.

Some embodiments of the present disclosure include a MEMS microphone package. The MEMS microphone package includes a substrate and a circuit device mounted on the substrate in the form of a flip-chip. The MEMS microphone package also includes a sensor disposed on the substrate and electrically connected to the substrate and the circuit device. The MEMS microphone package further includes a cap disposed on the substrate and covering the circuit device and the sensor.

In some embodiments, the circuit device is embedded in the substrate and has through silicon via structures electrically connected to the substrate.

In some embodiments, a portion of the circuit device is disposed between the substrate and the sensor.

In some embodiments, the circuit device has a conductive pad, and the sensor has a connecting structure that is connected to the conductive pad.

In some embodiments, the sensor is adjacent to the circuit device and electrically connected to the circuit device by an interconnection structure embedded in the substrate.

In some embodiments, the MEMS microphone package further includes an acoustic port penetrating the substrate or the cap.

BRIEF DESCRIPTION OF THE DRAWINGS

Aspects of the embodiments of the present disclosure can be understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1:
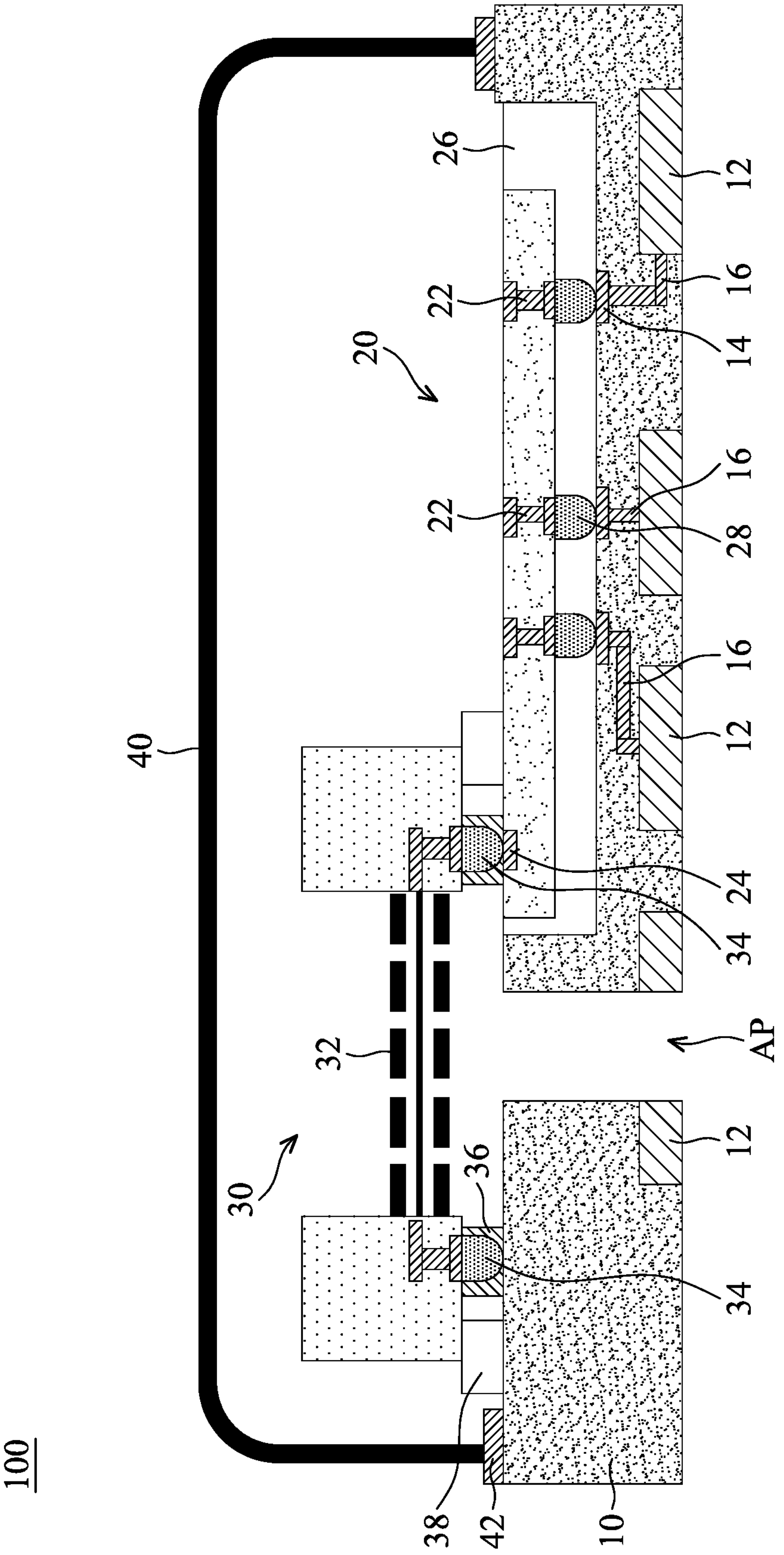
FIG. 1 is a partial cross-sectional view illustrating a micro-electro-mechanical system (MEMS) microphone package according to some embodiments of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact. In addition, the present disclosure may repeat reference numerals and/or letters in the various examples. This repetition is for the purpose of simplicity and clarity and does not in itself dictate a relationship between the various embodiments and/or configurations discussed.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. That is, when there is no specific description of the terms "about," "approximately" and "substantially", the stated value includes the meaning of "about," "approximately" or "substantially".

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the relevant art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity and does not in itself dictate a relationship between the various embodiments and/or configurations discussed.

FIG. 1 is a partial cross-sectional view illustrating a micro-electro-mechanical system (MEMS) microphone package 100 according to some embodiments of the present disclosure. For example, the MEMS microphone may be a capacitive microphone. It should be noted that some components of the MEMS microphone package 100 have been omitted in FIG. 1 and FIG. 2 for the sake of brevity.

Referring to FIG. 1, in some embodiments, the MEMS microphone package 100 includes a substrate 10. The substrate 10 may be a bulk semiconductor substrate or include a composite substrate formed of different materials, and the substrate 10 may be doped (for example, using p-type or n-type dopants) or undoped. For example, the substrate 10 may include a semiconductor substrate, a glass substrate, or a ceramic substrate, such as a silicon substrate, a silicon germanium substrate, a silicon carbide, an aluminum nitride substrate, a sapphire substrate, the like, or a combination thereof. Moreover, the substrate 10 may include a semiconductor-on-insulator (SOI) substrate formed by disposing a semiconductor material on an insulating layer.

As shown in FIG. 1, in some embodiments, the substrate 10 has a conductive structure 12. For example, the conductive structure 12 may include aluminum (Al), copper (Cu), tungsten (W), an alloy thereof, any other applicable conductive material, or a combination thereof. Moreover, the conductive structure 12 may be (or include) conductive lines or conductive pads, but the present disclosure is not limited thereto.

Referring to FIG. 1, in some embodiments, the MEMS microphone package 100 includes a circuit device 20 mounted on the substrate 10 in the form of a flip-chip. In more detail, as shown in FIG. 1, the circuit device 20 has through silicon via (TSV) structures 22 that are electrically connected to the conductive structure 12. For example, the circuit device 20 may be an application specific integrated circuit (ASIC).

As shown in FIG. 1, in some embodiments, the circuit device 20 is embedded in the substrate 10. In this embodiment, the MEMS microphone package 100 includes an underfill glue 26 disposed between the circuit device 20 and the substrate 10, and the MEMS microphone package 100 further includes solder balls 28 penetrating the underfill glue 26 and electrically connected to the through silicon via structures 22 and the conductive structure 12.

The underfill glue 26 may include insulating material. The insulating material may include, for example, an oxide such as silicon oxide, a nitride such as silicon nitride, the like, or a combination thereof. The insulating material may be deposited in the trench formed in the substrate 10, and the insulating material may be deposited by metal organic chemical vapor deposition (MOCVD), ALD, MBE, LPE, the like, or a combination thereof.

A mask layer (not illustrated) may be disposed on the insulating material, and then an etching process is performed to etch the insulating material to form the underfill glue 26. The underfill glue 26 may have a trench and concave holes that expose the conductive pads 14 of the substrate 10.

For example, the mask layer may include a photoresist, such as a positive photoresist or a negative photoresist. Moreover, the mask layer may include a hard mask and may include silicon oxide ($SiO_2$), silicon nitride (SiN), silicon oxynitride (SiON), silicon carbide (SiC), silicon carbonitride (SiCN), the like, or a combination thereof. The mask layer may be a single layer or a multilayer structure. The mask layer may be formed by a deposition process, a photolithography process, other suitable processes, or a combination thereof. The deposition process includes spinon coating, CVD, ALD, the like, or a combination thereof. For example, the photolithography process may include photoresist coating (for example, spin coating), soft baking, mask aligning, exposure, post-exposure baking (PEB), developing, rinsing, drying (for example, hard baking), other suitable processes, or a combination thereof.

Then, the solder balls 28 may be formed in the concave holes, and the circuit device 20 is formed in the trench of the underfill glue 26, so that the through silicon via structures 22 are connected to the solder balls 28.

In other words, the solder balls 28 may be in direct contact with the conductive pad 14, and the inner-conductive line 16 of the substrate 10 may connect the conductive pad 14 to the conductive structure 12, so that the circuit device 20 may be electrically connected to the conductive structure 12, but the present disclosure is not limited thereto.

Referring to FIG. 1, in some embodiments, the MEMS microphone package 100 includes a sensor 30 disposed on the substrate 10 and electrically connected to the substrate and the circuit device 20. As shown in FIG. 1, in some embodiments, the sensor 30 has a connecting structure 34 disposed on the bottom, and the connecting structure 34 is electrically connected to the substrate 10 and the circuit device 20.

As shown in FIG. 1, a portion of the sensor 30 is stacked on the circuit device 20. That is, a portion of the circuit device 20 is disposed between the substrate 10 and the sensor In other words, the substrate 10, the circuit device 20, and the sensor 30 form a stack structure instead of wire bonding.

The sensor 30 may be a MEMS microphone. In this embodiment, the sensor includes a sensing structure 32 for sensing sound waves. For example, the sensing structure 32 may include a backplate and a diaphragm that face each other.

The backplate may have sufficient stiffness such that it would not be bending or movable when the sound waves pass through the backplate. For example, the backplate may be a stiff perforated element, but the present disclosure is not limited thereto. The diaphragm is movable or displaceable relative to the backplate. The diaphragm is configured to sense the sound waves received from an acoustic port AP.

As show in FIG. 1, in this embodiment, the substrate 10 has an acoustic port AP that corresponds to the sensing structure 32. That is, the acoustic port AP penetrates the substrate 10. The acoustic port AP allows sound waves to pass through and/or enter the sensing structure 32. In more detail, the displacement change of the diaphragm relative to the backplate causes a capacitance change between the diaphragm and the backplate. The capacitance change is then converted into an electric signal by circuitry connected with the diaphragm and the backplate, and the electrical signal is sent out of the sensor 30 to the circuit device 20.

As shown in FIG. 1, in some embodiments, the circuit device 20 has a conductive pad 24, and the sensor 30 has a connecting structure 34 that is connected to the conductive pad 24, so that the electrical signal may be sent out of the sensor 30 to the circuit device 20. For example, the conductive pad 24 and the connecting structure 34 may include metal, and the metal may be gold (Au), nickel (Ni), platinum (Pt), palladium (Pd), iridium (Ir), titanium (Ti), chromium (Cr), tungsten (W), aluminum (Al), copper (Cu), the like, an alloy thereof, or a combination thereof, but the present disclosure is not limited thereto.

For example, the connecting structure 34 may be a gold ball and surrounded by a metal glue 36. The metal glue 36 may be a silver glue, but the present disclosure is not limited thereto. Moreover, the sensor 30 may include a die-bonding glue 38 that connects the substrate 10 and the circuit device 20. The die-bonding glue 38 may include insulating material. Examples of the insulating material have described above, and will not be repeated here.

Referring to FIG. 1, in some embodiments, the MEMS microphone package 100 includes a cap 40 covering the circuit device 20 and the sensor 30 and separated from the circuit device 20 and the sensor 30. For example, the cap 40 may be a metal cap, and connected to the substrate 10 by solder 42, but the present disclosure is not limited thereto. Examples of the metal have described above, and will not be repeated here.

Figure 2:
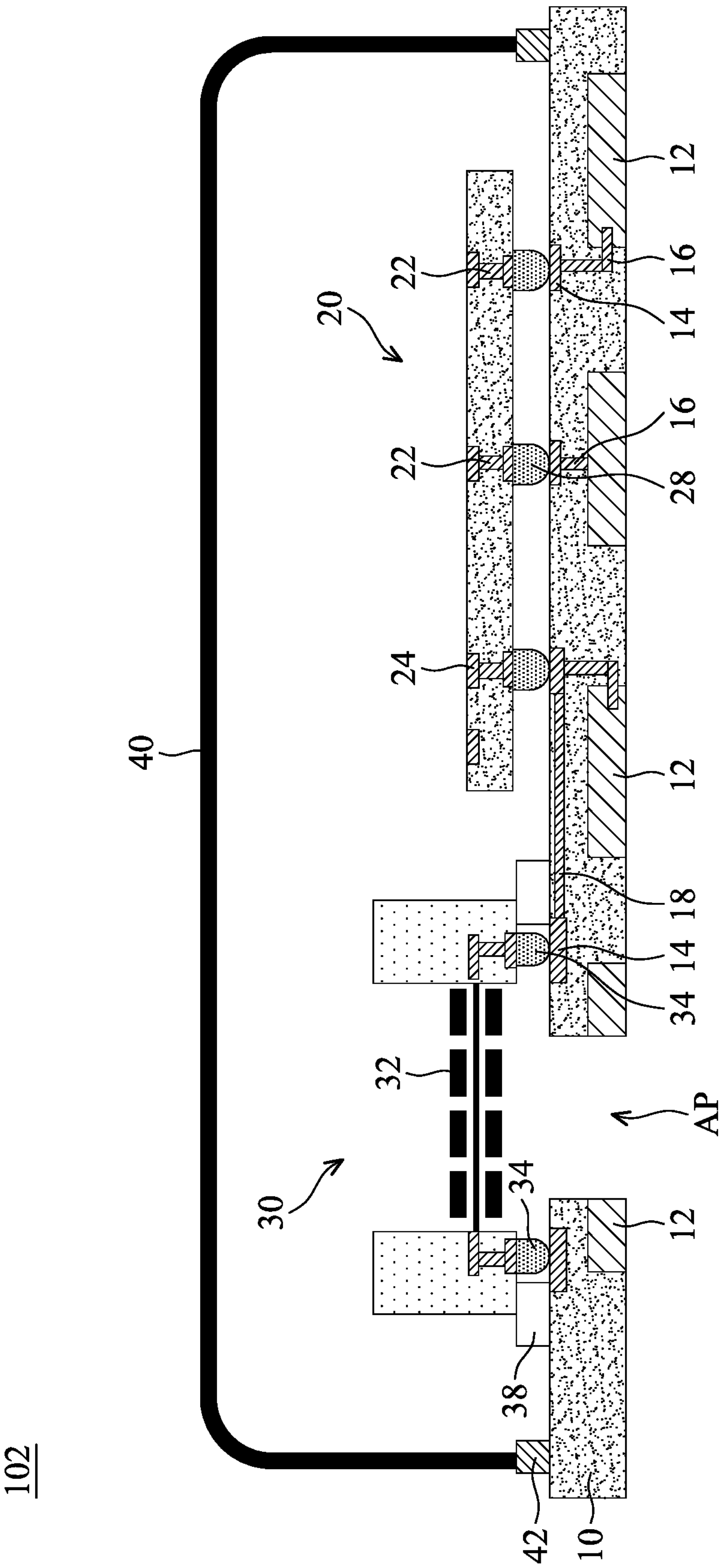
FIG. 2 is a partial cross-sectional view illustrating a micro-electro-mechanical system (MEMS) microphone package according to some other embodiments of the present disclosure.
Figure 3:
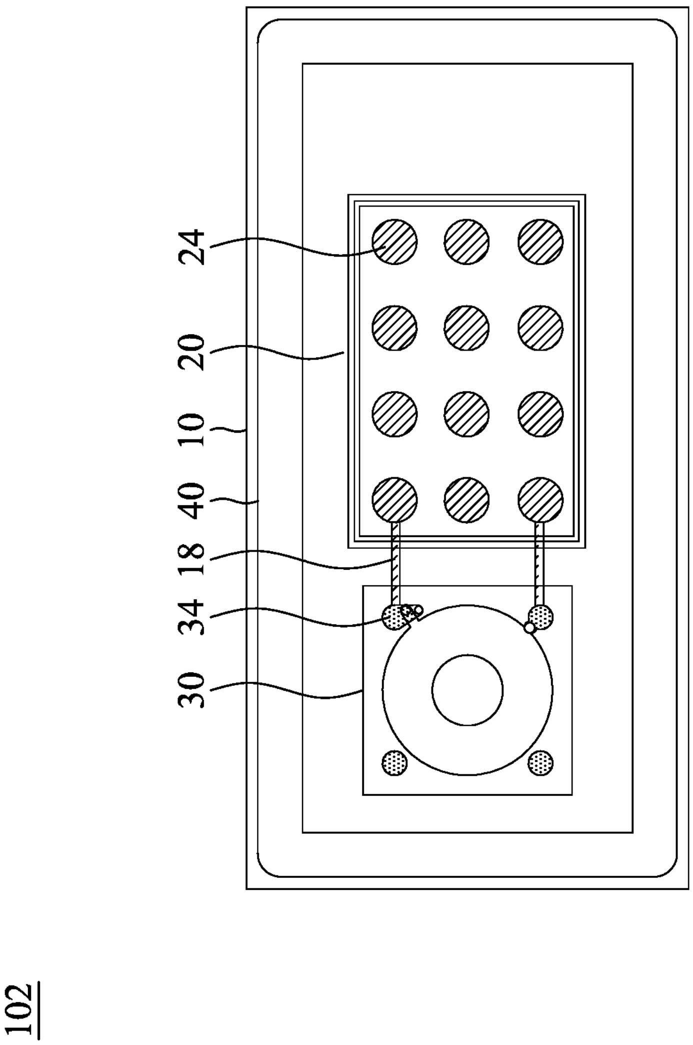
FIG. 3 is a partial top view illustrating the micro-electro-mechanical system (MEMS) microphone package in FIG. 2.

FIG. 2 is a partial cross-sectional view illustrating a micro-electro-mechanical system (MEMS) microphone package 102 according to some other embodiments of the present disclosure. FIG. 3 is a partial top view illustrating the micro-electro-mechanical system (MEMS) microphone package 102 in FIG. 2. It should be noted that the MEMS microphone package 102 shown in FIG. 3 may not exactly correspond to FIG. 2. Similarly, some components of the MEMS microphone package 102 have been omitted in FIG. 2 and FIG. 3 for the sake of brevity.

The MEMS microphone package 102 shown in FIG. 2 may have a similar structure to the MEMS microphone package 100 shown in FIG. 1. That is, the MEMS microphone package 102 includes a substrate 10 and a circuit device 20 mounted on the substrate 10 in the form of a flip-chip. The MEMS microphone package 102 also includes a sensor 30 disposed on the substrate 10 and electrically connected to the substrate 10 and the circuit device 20. The MEMS microphone package 102 further includes a cap 40 disposed on the substrate 10 and covering the circuit device 20 and the sensor 30.

As shown in FIG. 2 and FIG. 3, in this embodiment, the sensor 30 is adjacent to the circuit device 20 and electrically connected to the circuit device 20 by an interconnection structure 18 embedded in the substrate 10. The interconnection structure 18 may be a conductive line, but the present disclosure is not limited thereto.

Figure 4:
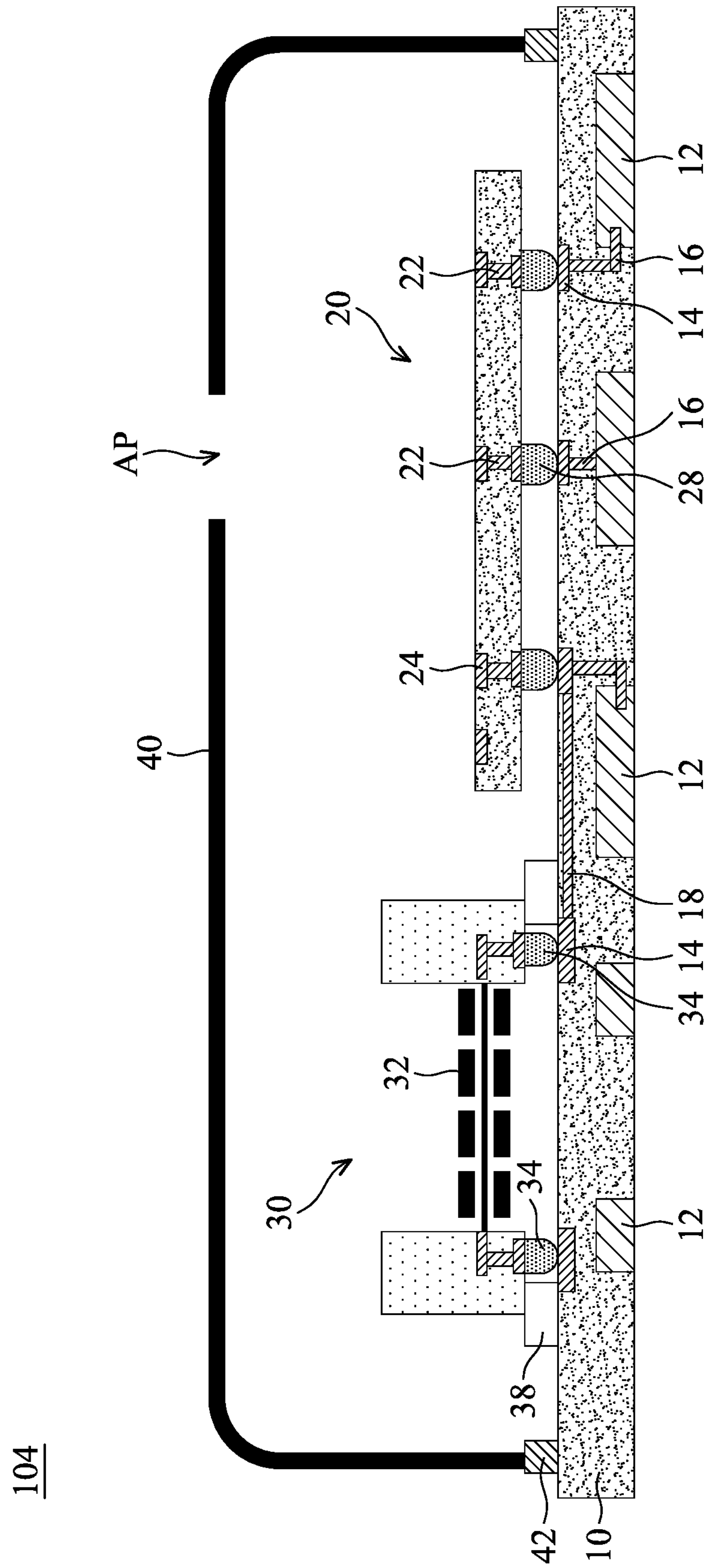
FIG. 4 is a partial cross-sectional view illustrating a micro-electro-mechanical system (MEMS) microphone package according to some other embodiments of the present disclosure.

FIG. 4 is a partial cross-sectional view illustrating a micro-electro-mechanical system (MEMS) microphone package 104 according to some other embodiments of the present disclosure. Similarly, some components of the MEMS microphone package 104 have been omitted in FIG. 4 for the sake of brevity.

The MEMS microphone package 104 shown in FIG. 4 may have a similar structure to the MEMS microphone package 102 shown in FIG. 2. The main difference from the MEMS microphone package 102 shown in FIG. 2 is that the cap 40 of the MEMS microphone package 104 includes an acoustic port AP for receiving sound waves. In other words, the acoustic port AP penetrates the cap 40 instead of the substrate 10.

Although the preceding figures all show that there are one circuit device 20 and one sensor 30 disposed on the substrate 10, the present disclosure is not limited thereto.

Figure 5:
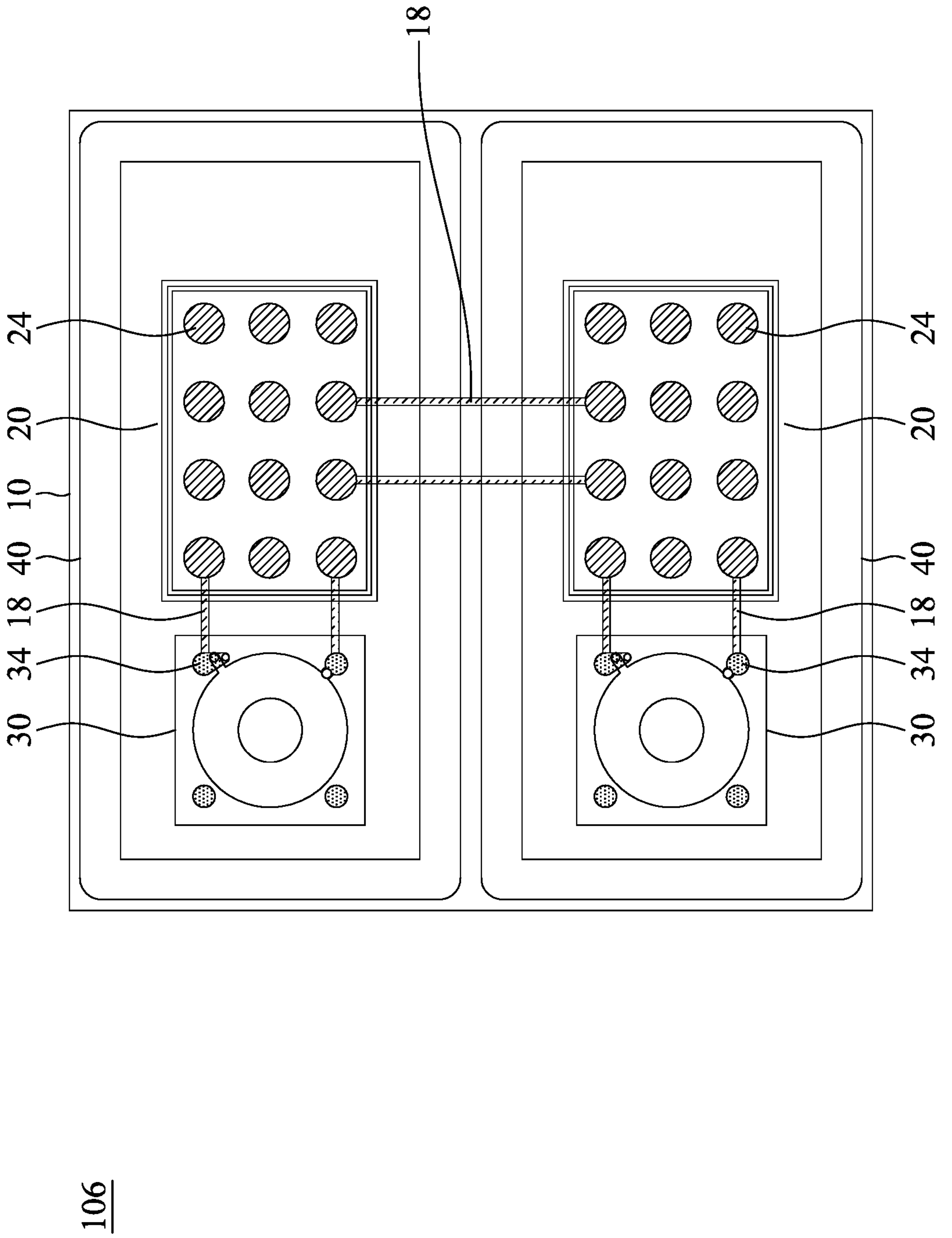
FIG. 5 is a partial top view illustrating a micro-electro-mechanical system (MEMS) microphone package according to some other embodiments of the present disclosure.

FIG. 5 is a partial top view illustrating a micro-electro-mechanical system (MEMS) microphone package 106 according to some other embodiments of the present disclosure. Similarly, some components of the MEMS microphone package 106 and the MEMS microphone package 108 have been omitted in FIG. 5 for the sake of brevity.

Referring to FIG. 5, in some embodiments, there are two circuit devices 20, two sensors 30, and two caps 40 disposed on the substrate 10, and each cap 40 cover one circuit device 20 and one sensor 30, but the present disclosure is not limited thereto. In some other embodiments, there are two or more circuit devices 20 and two or more sensors 30 covered by one cap 40. The number of circuit devices 20 or sensors 30 may be adjusted depending on actual needs.

As noted above, in the embodiments of the present disclosure, since the MEMS microphone package may use a stack structure instead of wire bonding. This can effectively reduce the amount of space in the package, thereby reducing the overall size of the package. The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize, in light of the description provided herein, that the disclosure can be practiced without one or more of the specific features or advantages of a particular embodiment. In other instances, additional features and advantages may be recognized in certain embodiments that may not be present in all embodiments of the disclosure.

What is claimed is:

1. A MEMS microphone package, comprising:
- a substrate having a conductive structure;
- a circuit device having through silicon via structures electrically connected to the conductive structure;
- a sensor disposed on the substrate and having a connecting structure disposed on a bottom of the sensor, wherein the connecting structure is electrically connected to the substrate and the circuit device;
- a cap covering the circuit device and the sensor and separated from the circuit device and the sensor; and
- solder balls electrically connected to the through silicon via structures and the conductive structure, wherein the circuit device is embedded in the substrate.

2. The MEMS microphone package as claimed in claim 1, wherein a portion of the sensor is stacked on the circuit device.

3. The MEMS microphone package as claimed in claim 1, further comprising:
- an underfill glue disposed between the circuit device and the substrate,
- wherein the solder balls penetrate the underfill glue.

4. The MEMS microphone package as claimed in claim 1, wherein the sensor comprises a sensing structure for sensing sound waves.

5. The MEMS microphone package as claimed in claim 4, wherein the substrate has an acoustic port corresponding to the sensing structure.

6. The MEMS microphone package as claimed in claim 1, wherein the cap comprises an acoustic port for receiving sound waves.

* * * * *